United States Patent [19]

Hanley

[11] Patent Number: 5,746,834
[45] Date of Patent: May 5, 1998

[54] METHOD AND APPARATUS FOR PURGING BARREL REACTORS

[75] Inventor: Thomas Martin Hanley, O'Fallon, Mo.

[73] Assignee: MEMC Electronics Materials, Inc., St. Peters, Mo.

[21] Appl. No.: 582,650

[22] Filed: Jan. 4, 1996

[51] Int. Cl.$^6$ .................................................. C23C 16/00
[52] U.S. Cl. ............................................ 118/715; 427/248.1
[58] Field of Search ...................... 118/715; 427/248.1; 204/298.07

[56] References Cited

U.S. PATENT DOCUMENTS

| | | | |
|---|---|---|---|
| 4,147,571 | 4/1979 | Stringfellow et al. | 148/175 |
| 4,597,983 | 7/1986 | Kuhne et al. | 427/27 |
| 4,748,135 | 5/1988 | Frijlink | 437/102 |
| 4,751,192 | 6/1988 | Hirooka et al. | 437/4 |
| 4,854,263 | 8/1989 | Chang et al. | 118/715 |
| 4,928,626 | 5/1990 | Carlson et al. | 118/715 |
| 4,989,541 | 2/1991 | Mikoshiba et al. | 118/723 ME |
| 5,279,986 | 1/1994 | Maloney et al. | 437/81 |
| 5,298,107 | 3/1994 | Scudder et al. | 156/610 |
| 5,316,794 | 5/1994 | Carlson et al. | 427/248.1 |
| 5,332,443 | 7/1994 | Chew et al. | 118/729.2 |
| 5,338,363 | 8/1994 | Kawata et al. | 118/725 |
| 5,345,999 | 9/1994 | Hosokawa | 165/80.2 |
| 5,352,636 | 10/1994 | Beinglass | 437/235 |
| 5,355,066 | 10/1994 | Lowrance | 318/640 |

FOREIGN PATENT DOCUMENTS

| | | | |
|---|---|---|---|
| 61-143579 | 7/1986 | Japan. | |
| 61-156270 | 7/1987 | Japan | 118/725 |
| 62-261119 | 11/1987 | Japan | 118/715 |

OTHER PUBLICATIONS

Applied Materials System Manual; AMC–7810/11 and AMC–7820/21 Cylindrical Epitaxial Reactors; patent notice; Nov. 1982 pp. 4–1 through 4–12 and 4–50 through 4–55.

Applied Materials System Manual; AMC–7800/7900 Series Cylindrical Epitaxial Reactors; patent notice; Sep. 1981; pp. 4–1 through 4–10.

Primary Examiner—R. Bruce Breneman
Assistant Examiner—Jeffrie R. Lund
Attorney, Agent, or Firm—Senninger, Powers, Leavitt & Roedel

[57] ABSTRACT

A reactor for depositing a material on a semiconductor wafer by a chemical vapor deposition process using a reactant gas. The reactor includes a shell defining a reaction chamber sized to receive at least one semiconductor wafer. The shell has a jet port cavity opening into the reaction chamber and extending away from the reaction chamber. The reactor also includes a reactant gas delivery system for delivering the reactant gas to the reaction chamber. The reactant gas delivery system includes a nozzle positioned within the jet port cavity for directing the reactant gas into the reaction chamber, a reactant gas source, and a reactant gas line extending between the reactant gas source and the nozzle. The reactor also includes a purge gas delivery system for delivering a purge gas to the reaction chamber. The purge gas delivery system includes a purge gas port opening into the jet port cavity for directing the purge gas into the jet port cavity, a purge gas source, and means for delivering the purge gas from the purge gas source to the purge gas port.

15 Claims, 6 Drawing Sheets

METHOD AND APPARATUS FOR PURGING BARREL REACTORS

BACKGROUND OF THE INVENTION

This invention relates generally to barrel reactors used to deposit material on semiconductor wafers by chemical vapor deposition, and more particularly to a method and apparatus for purging reactant gases from jet port cavities of barrel reactors.

Barrel reactors are used to deposit epitaxial layers on semiconductor wafers. Epitaxy is a method of growing a thin layer of material on a semiconductor wafer so that the lattice structure is identical to that of the wafer. Using this method, a layer having different conductivity is applied to the semiconductor wafer to achieve the necessary electrical properties. For example, a lightly doped epitaxial layer grown over a heavily doped substrate permits a CMOS device to be optimized for latch up immunity as a result of the low resistance of the substrate. Other advantages, such as precise control of the dopant concentration profile and freedom from oxygen, are also achieved.

Generally, the chemical vapor deposition process is accomplished by introducing a reactant gas comprising the deposition material (e.g., silicon) into a reaction chamber of the barrel reactor containing the wafers. The wafers are held within the reaction chamber in a generally vertical orientation on a susceptor so that one face of the wafer is exposed to the reactant gas. The reaction chamber vessel is typically an inverted bell jar made of quartz. A stainless steel gas ring sits atop an upper opening of the bell jar. The reactant gas is injected into the reaction chamber through gas injection jets which are recessed within jet port cavities spaced about the interior of the gas ring. A stainless steel seal plate atop the gas ring seals the wafers within the reaction chamber. The seal plate may be moved to open the chamber for inserting or removing the semiconductor wafers from the vessel.

It is important that the layer of silicon deposited on the wafers not be contaminated with metals, such as iron, nickel and molybdenum, as contamination can be detrimental to the minority carrier lifetime of the epitaxial layer. Contamination of the layer with non-metallic foreign particles should also be avoided. Although the quartz reaction chamber vessel is not a source of metals contamination, the stainless steel of the gas ring may be a source of metals contamination. Contact with certain byproducts (e.g., HCl) of the reactant gas in the presence of residual moisture can cause the stainless steel to corrode. Further, removing deposits of silicon from the susceptor by chemical etching may introduce corrosive agents such as HCl into the reaction chamber and cause the stainless steel to corrode. The corrosion products from the stainless steel may become entrained within the deposited material thereby contaminating the wafers. Moreover, $SiO_2$ deposits formed in the reaction chamber by a reaction of the reactant gas with residual oxygen and/or moisture in the barrel reactor must be cleaned, or the deposits may flake off and contaminate the wafers.

To avoid contamination from the gas ring, the barrel reactor is constructed to divert the reactant gas away from the gas ring with baffles and to displace the reactant gas by directing purge gas across the exposed areas of the gas ring. The conventional purge system comprises a single line of purge gas which branches into multiple lines before reaching the reaction chamber vessel for delivering purge gas to several different locations around the reaction chamber. The lines are connected to ports extending through the seal plate and gas ring for delivering purge gas to those areas of the seal plate and gas ring exposed to reactant gas.

In operation of a typical barrel reactor, the purge gas system first purges the reaction chamber with nitrogen to rid the chamber of oxygen. Following the nitrogen purge, hydrogen is fed through the purge lines for several minutes prior to injecting reactant gas into the reaction chamber. The flow of hydrogen through some of the ports continues throughout the deposition cycle and thereafter to purge reactant gas from the chamber. Before the seal plate is removed from the chamber, the hydrogen is removed from the chamber using another nitrogen purge.

The existing systems of baffles and purge gas to avoid contamination are only partially effective. In particular, the purge systems are not adequate to purge substantially all of the oxygen and water vapor from the jet port cavities. As a result of the presence of oxygen (in the form of free oxygen or water vapor), significant deposits of $SiO_2$ are formed within the jet port cavities of the gas ring during each deposition cycle. These deposits must be removed after only a few cycles of barrel reactor operation, but the act of cleaning the $SiO_2$ deposits from the jet port cavities can cause gas ring corrosion because any water introduced to the cavities during cleaning will promote reaction between the HCl and the stainless steel if it is not removed. In addition, the shape of the jet port cavities often makes it difficult to remove all of the water.

Periodically, the gas injection jets must be aimed to optimize the epitaxial layer deposited from the reactant gases on the wafers within the barrel reactor. The act of manually cleaning the jet port cavities can result in the gas injection jets being inadvertently moved thereby requiring more frequent re-aiming. The act of aiming the injection jets can dislodge deposits on the jet or in the jet port cavity thereby providing still another potential source of contamination.

SUMMARY OF THE INVENTION

Among the several objects and features of the present invention may be noted the provision of a method and apparatus which purge reactant gases from the jet port cavities of an epitaxial barrel reactor; the provision of such a method and apparatus which reduce the downtime necessary to remove deposits from the gas injection jets and jet port cavities; the provision of such a method and apparatus which reduce the amount of chemical attack to the gas injection jets and jet port cavities; the provision of such a method and apparatus which reduce the frequency of gas injection jet aiming; and the provision of such a method and apparatus which reduce the amount of contamination to the epitaxial layer of the semiconductor wafers.

Briefly, apparatus of this invention is a reactor for depositing a material on a semiconductor wafer by a chemical vapor deposition process using a reactant gas. The reactor comprises a shell, a reactant gas delivery system and a purge gas delivery system. The reactor shell defines a reaction chamber sized to receive at least one semiconductor wafer. The shell has a jet port cavity opening into the reaction chamber and extending away from the chamber. The reactant gas delivery system includes a gas injection jet positioned within the jet port cavity for directing the reactant gas into the reaction chamber, a reactant gas source, and a reactant gas line extending between the reactant gas source and the injection jet. The purge gas delivery system includes a purge gas port opening into the jet port cavity for directing a purge gas into the jet port cavity to purge the reactant gas, air and moisture from the cavity, a purge gas source, and means for delivering the purge gas from the purge gas source to the purge gas port.

A method of the present invention is used to deposit a material on a semiconductor wafer by a chemical vapor deposition process using a reactant gas in a reactor similar to that described above. The method includes the steps of inserting the semiconductor wafer into the reaction chamber and sealing the reaction chamber. The reactant gas is introduced into the sealed reaction chamber to deposit the material on the semiconductor wafer. The flow of reactant gas is stopped and a purge gas is introduced into the reaction chamber to purge the reactant gas from the reaction chamber. The step of introducing the purge gas includes the step of directing the purge gas into the jet port cavity to purge the reactant gas from the jet port cavity. The purged reactant chamber is opened and the wafer is removed from the reaction chamber.

Other objects and features of the invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
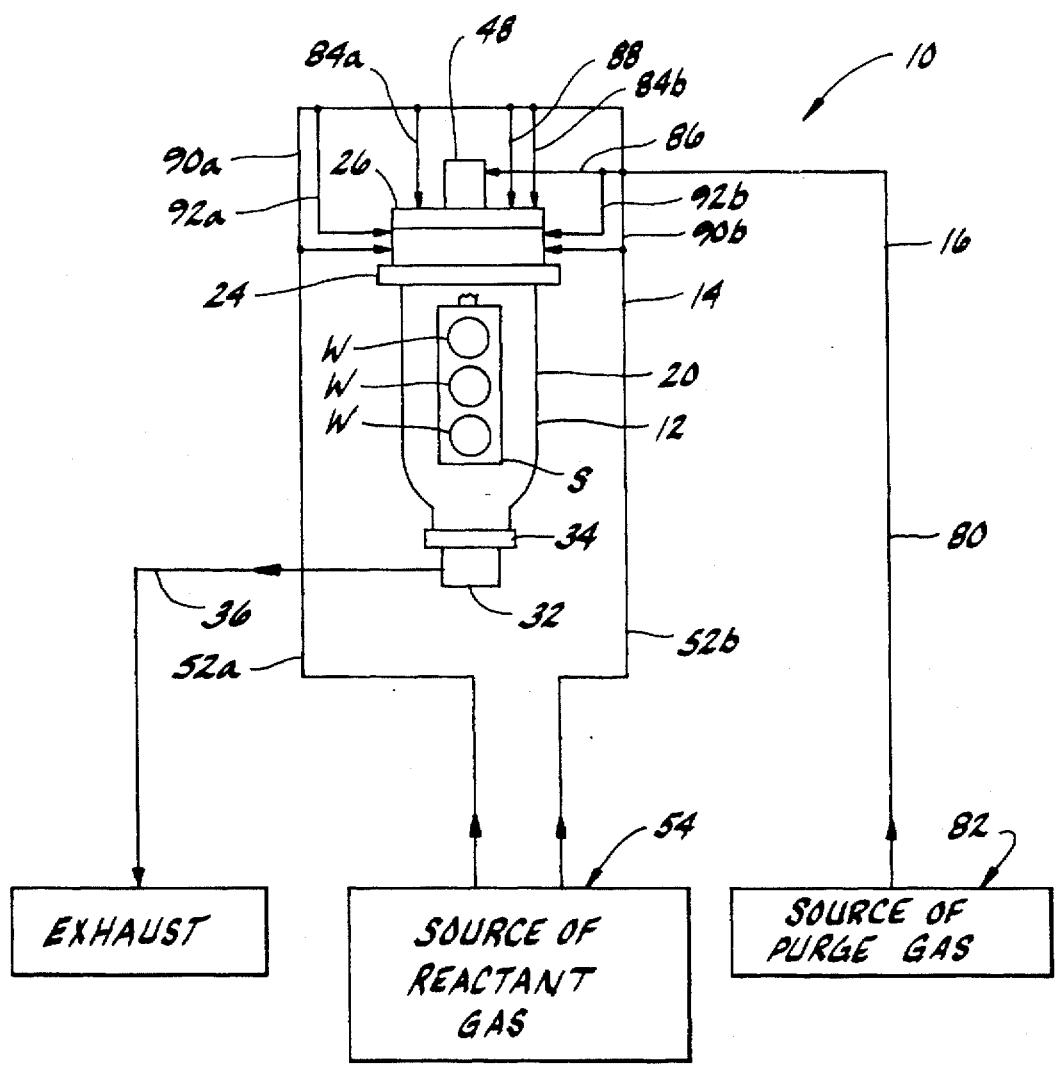
FIG. 1 is a simplified schematic of a barrel reactor showing its purge gas and reactant gas delivery systems.

Referring now to the drawings and in particular to FIG. 1, a barrel reactor indicated generally at 10 is of the type which is used to deposit a material (e.g., silicon) on a semiconductor wafer W held on a susceptor S within the barrel reactor 10 using a chemical vapor deposition process. The barrel reactor 10 includes a shell 12, a reactant gas delivery system 14 and a purge gas delivery system 16.

Figure 2:
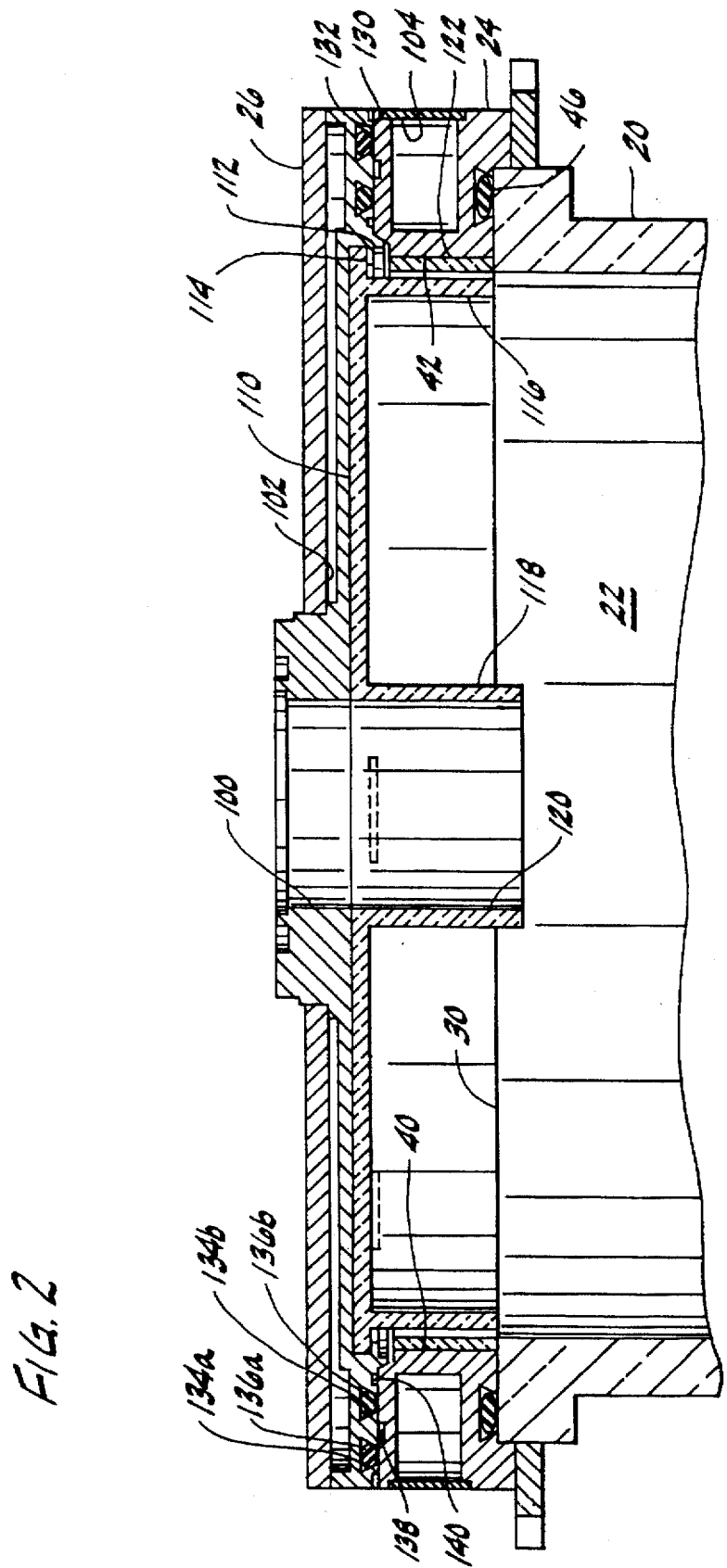
FIG. 2 is a fragmentary cross section of the barrel reactor with parts removed for clarity.

As shown in FIG. 2, the shell 12 comprises a quartz reaction chamber vessel 20 defining a reaction chamber 22, a gas ring 24 and a seal plate 26. The reaction chamber vessel 20 has an open top 30, and a vent or exhaust port 32 (FIG. 1) at its bottom for exhausting gases from the reaction chamber 22. A fitting 34 is located on the exhaust port 32 for connecting an exhaust line 36 to the vessel 20. The gas ring 24 is made of stainless steel and is located adjacent and above the reaction chamber vessel 20. The ring 24 has an interior surface 40 defining an opening 42 through which wafers W carried by a susceptor S pass when entering and exiting the reaction chamber 22. Two jet port cavities 44a, 44b (FIG. 3) extend through the gas ring 24 at an angle into the reaction chamber 22. The interface between the gas ring 24 and reaction chamber vessel 20 is sealed by an O-ring 46 (FIG. 2) disposed in the gas ring 24 and sealingly engaging the reaction chamber vessel 20. The open top 30 of the reaction chamber vessel 20 is closed by the seal plate 26 which is movable from an open position (not shown) in which it is spaced away from the vessel for insertion and removal of the susceptor S carrying the wafers W, and a closed position (FIG. 2) in which the seal plate sealingly engages the gas ring 24 to close the open top 30 of the vessel 20 and isolate the reaction chamber 22 from the surrounding environment. The seal plate 26 includes a rotation housing 48 (FIG. 1) centrally-located on the seal plate which houses a rotation mechanism (not shown). The susceptor S supporting the wafers W hangs from the rotation mechanism for rotation of the susceptor during the deposition cycle of the barrel reactor 10.

Figure 3:
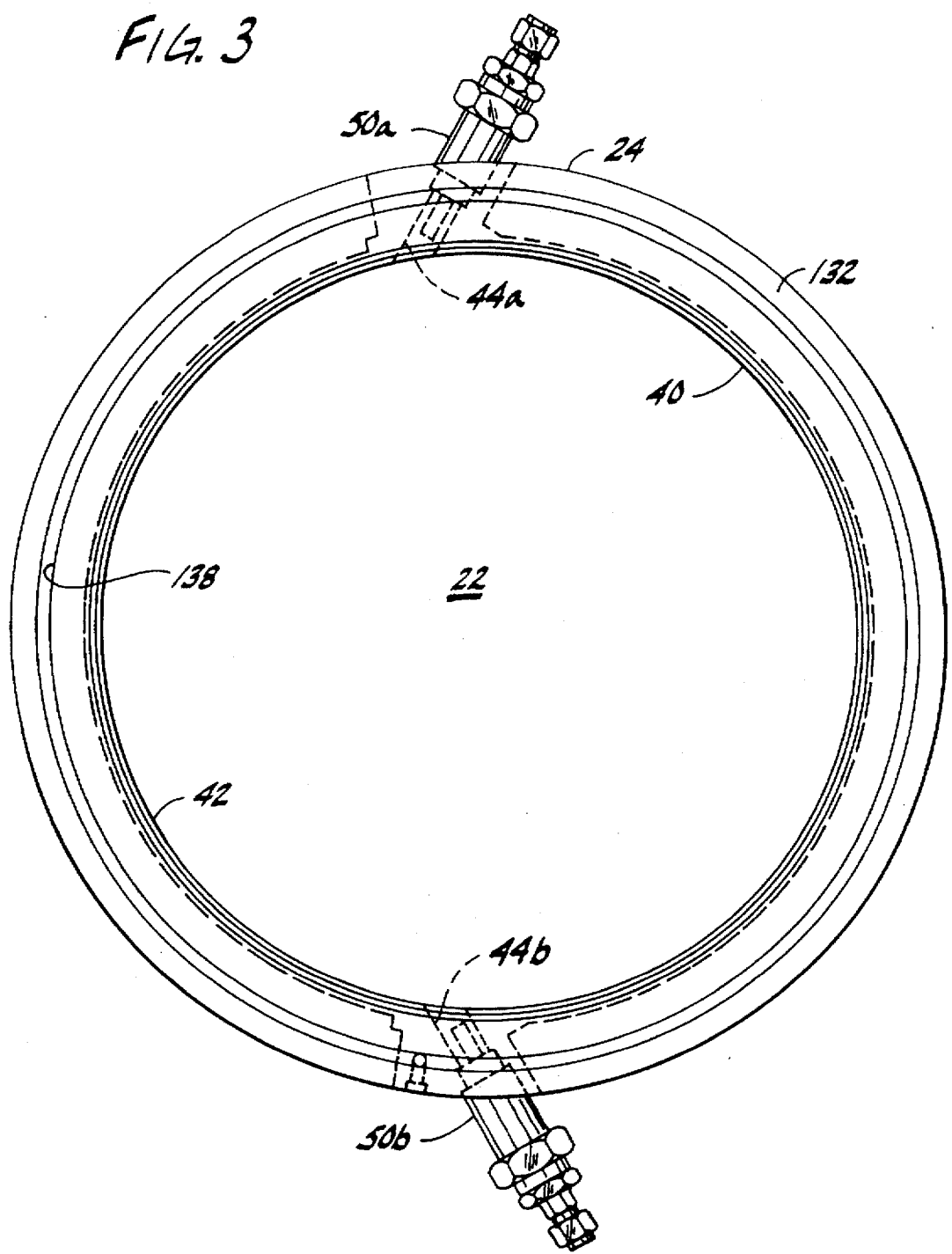
FIG. 3 is a schematic top plan of a gas ring and gas injector jets of the reactor.

As illustrated in FIGS. 1 and 3, the reactant gas delivery system includes gas injection jets 50a, 50b positioned in the jet port cavities 44a, 44b, reactant gas lines 52a, 52b, and a reactant gas source 54. Reactant gas (e.g., $SiCl_4$, $SiHCl_3$, $SiH_2Cl_2$, or $SiH_4$) is stored in the gas source 54 (i.e., a storage tank) until ready for use. When the reactant gas is needed, a valve (not shown) is opened and the gas travels through the reactant gas lines 52a, 52b to the respective gas injection jets 50a, 50b and into the reaction chamber 22 where the silicon in the gas is deposited on the wafers W by chemical vapor deposition.

Each of the gas injection jets 50a, 50b is comprised of an injection port body 56a, 56b (FIGS. 4 and 5) which has a threaded exterior portion for attaching the jet to mating threads in the jet port cavities 44a, 44b. An O-ring 58a, 58b is trapped between the injection ports bodies 56a, 56b and the jet port cavities 44a, 44b for sealing the interface. A gas port cap 60a, 60b is threaded onto the outward end of each injection port body 56a, 56b and another O-ring 62a, 62b between the cap and port body seals that interface. Each of the caps 60a, 60b includes a threaded exterior portion for connection with a fitting 63a, 63b on the respective reactant gas supply line 52a, 52b. Bores 64a, 64b extend through each of the injection port bodies 56a, 56b and a spool 66a, 66b is mounted within each of the bores. Each end of the spool has a chamfer 68a, 68b, 68a', 68b'. A ball end 70a, 70b of a nozzle 72a, 72b sits inboard of each of the inward chamfers 68a, 68b so that the nozzle may be swiveled within the port body 56a, 56b to adjust the direction in which the reactant gas enters the reaction chamber. Projecting inwardly from the bores 64a, 64b are annular flanges 74a, 74b which retain the ball ends 70a, 70b of the nozzles 72a, 72b within the injection port body bores 64a, 64b. A passage 76a, 76b extends through each of the gas injection jets 50a, 50b from the gas port cap 60a, 60b to the tip of the nozzle 72a, 72b for delivering the reactant gas to the reaction chamber.

Figure 4:
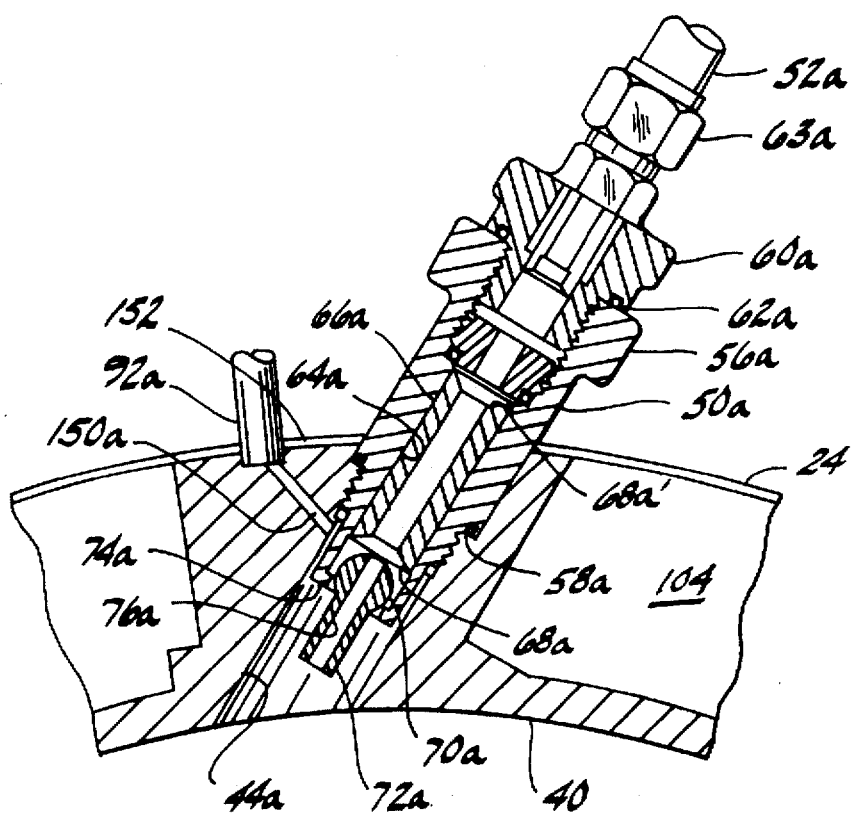
FIG. 4 is an enlarged fragmentary cross section of the gas ring showing one jet port cavity and nozzle.
Figure 5:
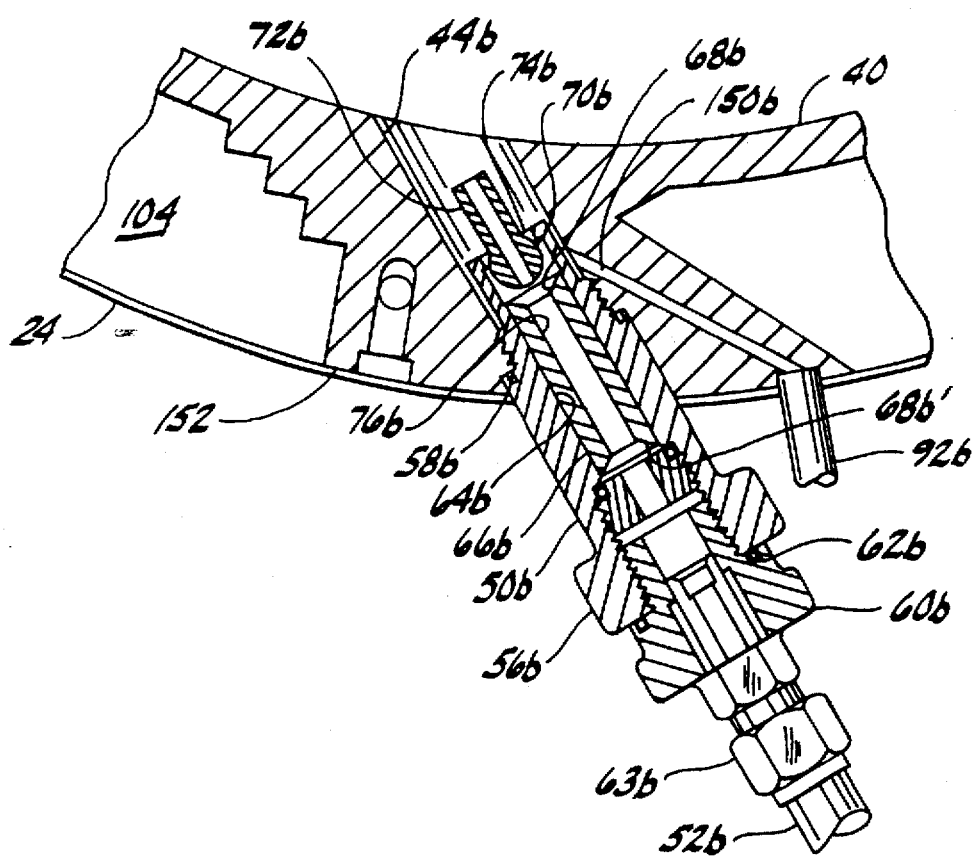
FIG. 5 is an enlarged fragmentary cross section of the gas ring showing another jet port cavity and nozzle.

The purge gas system 16 (FIG. 1) of the barrel reactor 10 includes a supply line 80 extending from a purge gas source generally indicated at 82 to the barrel reactor. As shown schematically in FIG. 1, the supply line 80 branches off into several purge lines including two baffle purge lines 84a, 84b, a rotation housing purge line 86, a seal plate purge line 88, two gas injection jet purge lines 90a, 90b, and two jet port cavity purge lines 92a, 92b (FIGS. 4 and 5). Each of these purge lines 84a–92b is connected to the seal plate 26 or the gas ring 24 to deliver purge gas to different regions of the seal plate and gas ring. The gas injection jet purge lines 90a, 90b join the reactant gas supply lines 52a, 52b and are coextensive for a distance to deliver purge gas through the gas injection jet passages 76a, 76b. Valves (not shown) are operable to selectively connect the gas injection jet purge lines 90a, 90b or the reactant gas lines 52a, 52b to the gas injection jets 50a, 50b.

The seal plate 26, gas ring 24 and a portion of the reaction chamber vessel 20 are shown in FIG. 2 with the seal plate in the closed position. The rotation housing 48, rotation mechanism and susceptor S are omitted from the drawing for clarity. Nonetheless, it may be seen that the seal plate 26 has a central opening 100 through which the susceptor S is attached to the rotation mechanism. The seal plate 26 has an internal annular passage 102 through which water is circulated to cool the seal plate. A similar passage 104 is formed in the gas ring 24 for circulating cooling water around the gas ring.

A quartz baffle plate 110 has a lip 112 which rests on tabs 114 (only two are shown) on the seal plate 26 for shielding the seal plate from the reaction chamber 22. The baffle plate 110 covers substantially all of the seal plate 26 which would otherwise be exposed to the gases in reaction chamber 22. An annular outer baffle 116 depends from the baffle plate 110 at a location inward of the perimeter of the baffle plate, and an annular inner baffle 118 depends from the baffle plate around a central opening 120 generally in registration with the central opening 100 of the seal plate. The inner baffle 118 helps to protect the hanger (not shown) connecting the susceptor S to the rotation mechanism. Similarly, the interior surface 40 of the gas ring 24 is covered by a quartz liner 122. The baffle plate 110 and the quartz liner 122 have openings (not shown) generally in registration with the jet port cavities 44a, 44b through which the reactant gas is injected into the reaction chamber 22 from the reactant gas lines 52a, 52b.

The baffle purge lines 84a, 84b deliver purge gas to the space between the outer baffle 116 and the quartz liner 118 to purge that space. The rotation housing purge line 86 delivers purge gas to the rotation housing 48, and down through the inner baffle 118. The seal plate purge line 88 delivers purge gas to a location between the gas ring 24 and seal plate 26 for purging the space between them.

Referring to FIGS. 2 and 3, the seal plate 26 has an annular surface 130 which overlies a corresponding surface 132 of the gas ring 24 when the seal plate is in its closed position (FIG. 2). A pair of concentric annular channels 134a, 134b in the seal plate 26 contain O-rings 136a, 136b which engage the annular surface 132 of the gas ring 22 when the seal plate is in the closed position for sealing with the gas ring and isolating the reaction chamber 22 from the surrounding environment. A channel 138 in the gas ring 24 between the O-rings 136a, 136b may be pumped down to a vacuum pressure for use in the detection of leaks in the O-ring seal. The seal plate 26 has an annular groove 140 which is concentric with and located radially inward from the inner O-ring channel 134b. The seal plate purge line 88 opens into the annular groove 140 for supplying purge gas to the groove. Purge gas delivered to the annular groove 140 seeps into the reaction chamber 22 and is ultimately exhausted through the port 32 at the bottom of the reaction chamber vessel 20.

FIG. 1 schematically illustrates that the gas injection jet purge lines 90a, 90b deliver purge gas to the gas injection jets 50a, 50b to purge the reactant gas from the internal passages 76a, 76b of the gas injection jets. The purge gas delivered to the gas injection jets enters into the reaction chamber 22 and is exhausted through the exhaust port 32 at the bottom of the chamber.

In the most preferred embodiment, shown in FIGS. 4 and 5, purge gas ports 150a, 150b extend obliquely through the gas ring 24 from an exterior surface 152 of the ring to the jet port cavities 44a, 44b. Although the ports 150a, 150b obliquely enter the jet port cavities 44a, 44b, the ports may perpendicularly enter the cavities without departing from the scope of the present invention. The jet port cavity purge lines 92a, 92b deliver purge gas from the purge gas source 82 to the jet port cavities 44a, 44b to purge reactant gas from within the cavities and from around the gas injection jets 50a, 50b. In prior reactors (not shown) lacking structure directing purge gas into the jet port cavities, it has been found that substantial amounts of $SiO_2$ accumulate in the jet port cavities and on the exterior surfaces of the gas injection jets 50a, 50b. However, by directing purge gas to the jet port cavities 44a, 44b with the purge gas delivery system 16 of the present invention, more of the oxygen and water vapor is removed from the cavities and gas injection jet 50a, 50b exteriors prior to introduction of the reactant gas into the reaction chamber 22. Further, directing purge gas into the jet port cavities 44a, 44b after the deposition cycle results in more of the reactant gas being removed from the cavities and gas injection jet 50a, 50b exteriors before the reaction chamber 22 is opened.

Figure 6:
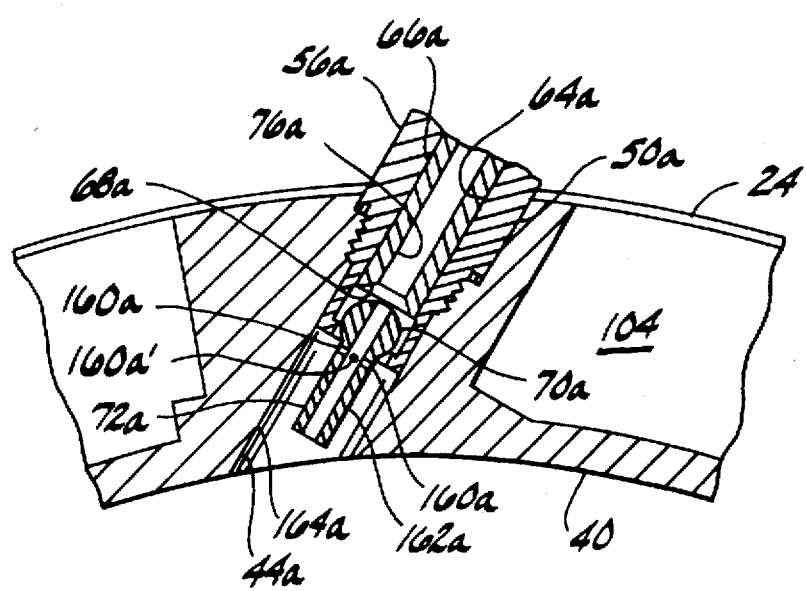
FIG. 6 is an enlarged fragmentary cross section of the gas ring showing another embodiment of a purge gas port.

In another embodiment shown in FIG. 6, four purge gas ports (only three are shown, designated 160a, 160a', and 160a") are angularly spaced at equal intervals about the exterior surface 162a of the nozzles 72a. The ports 160a, 160a', 160a") extend radially outward from the nozzle passage 76a to the exterior surface 162a of the nozzle. In this embodiment, the purge gas delivered to the nozzle 72a through the gas injection jet purge line 90a also purges the jet port cavity 44a by traveling through the passage 76a, outward through the purge gas ports 160a, 160a', 160a" and into the jet port cavity 44a toward a side 164a of the cavity. The jet port cavity purge lines 92a, 92b and the purge gas ports 150a, 150b are omitted from this second embodiment. Although the purge gas ports 160a, 160a', 160a" of the embodiment shown in FIG. 6 enter the jet port cavity 44a perpendicularly to the flow of gas through the nozzle passage 176a, the ports may be obliquely oriented relative to the nozzle passage without departing from the scope of the present invention. It is envisioned that the jet port cavity lines 92a, 92b and the purge gas ports 150a, 150b could be used in combination with the purge gas ports 160a, 160a', 160a".

The general operation of the barrel reactor 10 is well known to those of ordinary skill in the art. The susceptor S supporting the wafers W is hung from the rotation mechanism on the seal plate 26 while the seal plate is in its open position. The seal plate 26 is lowered into sealing engagement with the gas ring 24 to position the wafers W in the reaction chamber 22 and to seal the chamber from the surrounding environment by engaging the seal plate O-rings 136a, 136b with the gas ring 24. Purge gas is fed from the purge gas source 82 through the supply line 80 to the individual purge lines 84a-92b for purging oxygen and water vapor from the reaction chamber 22. The preferred sequencing of the two purge gases of the preferred embodiment (nitrogen and hydrogen) is described above, and is well known to those of ordinary skill in the art. After the reaction chamber 22 is sufficiently purged, reactant gas is delivered through the injection lines 52a, 52b to the gas injection jets 50a, 50b, out the nozzles 72a, 72b and into the reaction chamber 22 for deposition of silicon carried by the gas in a layer on the wafers W. Purge gas may continue to flow through some of the lines 84a-88, 92a, 92b during the deposition cycle to deflect reactant gases from some areas of the reaction chamber 22 (e.g., the space between the outer baffle 116 and the quartz liner 118). Upon completion of the deposition cycle, the flow of reactant gas is shut off, but the purge gas is delivered through each of the purge lines 84a-92b to purge the reaction chamber 22 of reactant gases.

Thus, the several objects of the present invention are achieved by the foregoing apparatus and method for purging the jet port cavities 44a, 44b of the barrel reactor 10. The presence of metal and particulate contaminates in the deposited layer on the semiconductor wafers W is significantly reduced. The jet port cavities 44a, 44b and gas injection jets 50a, 50b are more thoroughly purged and thus do not require cleaning as frequently as in the past. Moreover, it has been found that cleaning can be carried out with a dry cloth so that no water is introduced to the cavities or jets in the cleaning process. Accordingly, the barrel reactor 10 may be run for a longer period of time without being shut down for cleaning $SiO_2$ deposits, thereby increasing the throughput of wafers. In addition, the amount of chemical attack to the gas injection jets and jet port cavities is reduced by the method and apparatus of the present invention. Further, because the necessity for removing $SiO_2$ deposits is reduced, the opportunity for inadvertently moving the gas injection jets during manual cleaning is reduced and the frequency of gas injection jet aiming is reduced by this invention.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A reactor for depositing a material on a semiconductor wafer by a chemical vapor deposition process using a reactant gas, said reactor comprising:

a shell defining a reaction chamber sized to receive at least one semiconductor wafer, said shell comprising a chamber vessel and a gas ring positioned adjacent the chamber vessel, the gas ring having a jet port cavity opening into said reaction chamber and extending away from the reaction chamber;

a reactant gas delivery system for delivering the reactant gas to the reaction chamber, said reactant gas delivery system comprising:

a) a nozzle positioned within the jet port cavity for directing the reactant gas into the reaction chamber;

b) a reactant gas source for storing the reactant gas prior to directing the reactant gas through the nozzle and into the reaction chamber; and c) a reactant gas line extending between the reactant gas source and the nozzle for delivering the reactant gas to the nozzle; and a purge gas delivery system including:

a) a purge gas port opening into said jet port cavity for directing the purge gas into the jet port cavity to purge the reactant gas from said cavity;

b) a purge gas source for storing a purge gas prior to directing the purge gas through the purge gas port and into the jet port cavity; and c) means for delivering the purge gas from the purge gas source to the purge gas port for purging the jet port cavity.

2. The reactor as set forth in claim 1 wherein the purge gas port is positioned on said nozzle and directed toward a side of the jet port cavity.

3. The reactor as set forth in claim 2 wherein said nozzle has a passage through which reactant gas may pass into the reaction chamber, and wherein said purge gas delivering means comprises a purge gas line connected to one of the nozzle and reactant gas line, and a valve for selectively admitting purge gas into the nozzle passage, the purge port communicating with the nozzle passage for directing purge gas into the jet port cavity.

4. The reactor as set forth in claim 3 wherein said purge gas port directs the purge gas into the jet port cavity in a lateral direction generally perpendicular to the longitudinal direction of the nozzle passage.

5. The reactor as set forth in claim 4 further comprising a plurality of purge ports positioned at angularly spaced locations around the nozzle passage.

6. The reactor as set forth in claim 1 wherein the purge gas port is positioned in a side of the cavity.

7. The reactor as set forth in claim 6 wherein the purge gas port is directed generally toward the nozzle.

8. The reactor as set forth in claim 7 wherein the longitudinal axis of the purge gas port is oblique to the longitudinal axis of the nozzle.

9. The reactor as set forth in claim 8 wherein said purge gas delivering means comprises a purge gas line extending between the purge gas source and the purge gas port.

10. The reactor as set forth in claim 1 wherein the purge gas port comprising a bore extending through the gas ring into the jet port cavity.

11. A method for depositing a material on a semiconductor wafer by a chemical vapor deposition process using a reactant gas in a reactor having a reaction chamber with a jet port cavity opening into the reaction chamber and a nozzle positioned within said jet port cavity for directing the reactant gas into the reaction chamber, the method comprising the steps of:

inserting the semiconductor wafer into the reaction chamber;

sealing the reaction chamber containing the semiconductor wafer;

purging air from the reaction chamber by introducing a purge gas into the reaction chamber, wherein the step of purging air includes the step of directing a purge gas into said jet port cavity thereby purging air from the jet port cavity;

introducing the reactant gas into the sealed reaction chamber to deposit the material on the semiconductor wafer within the reaction chamber;

stopping further introduction of the reactant gas into the reaction chamber;

purging the reactant gas from the reaction chamber by introducing the purge gas into the reaction chamber, wherein the step of introducing the purge gas includes the step of directing the purge gas into said jet port cavity thereby purging the reaction gas from the jet port cavity;

opening the purged reactant chamber; and removing the wafer from the reaction chamber.

12. The method as set forth in claim 11 wherein the step of directing the purge gas into the jet port cavity includes the step of directing the purge gas toward a side wall of the jet port cavity.

13. The method as set forth in claim 11 wherein the step of directing the purge gas into the jet port cavity includes the step of directing the purge gas toward the nozzle.

14. The method as set forth in claim 11 wherein:

the step of introducing the reactant gas comprises the step of delivering the reactant gas through a nozzle into the reaction chamber; and the step of introducing the purge gas comprises the step of delivering the purge gas through the nozzle to the jet port cavity.

15. A reactor for depositing a material on a semiconductor wafer by a chemical vapor deposition process using a reactant gas, said reactor having a shell defining a reaction chamber sized to receive at least one semiconductor wafer, said shell comprising a chamber vessel and a gas ring positioned adjacent the chamber vessel, the gas ring having a jet port cavity opening into said reaction chamber and extending away from the reaction chamber, and further comprising:

means for inserting the semiconductor wafer into the reaction chamber;

means for sealing the reaction chamber containing the semiconductor wafer;

means for purging air and the reactant gas from the reaction chamber by introducing a purge gas into the reaction chamber, wherein said purging means is adapted to direct a purge gas into the jet port cavity thereby purging the jet port cavity;

means for introducing the reactant gas into the sealed reaction chamber to deposit the material on the semiconductor wafer within the reaction chamber;

means for stopping further introduction of the reactant gas into the reaction chamber;

means for opening the purged reactant chamber; and means for removing the wafer from the reaction chamber.

* * * * *